United States Patent [19]

Hernandez et al.

[11] Patent Number: 4,734,818
[45] Date of Patent: Mar. 29, 1988

[54] DECOUPLING CAPACITOR FOR SURFACE MOUNTED LEADLESS CHIP CARRIERS, SURFACE MOUNTED LEADED CHIP CARRIERS AND PIN GRID ARRAY PACKAGES

[75] Inventors: Jorge M. Hernandez, Mesa; Aleta Gilderdale, Chandler, both of Ariz.

[73] Assignee: Rogers Corporation, Rogers, Conn.

[21] Appl. No.: 28,172

[22] Filed: Mar. 19, 1987

Related U.S. Application Data

[63] Continuation-in-part of Ser. No. 890,489, Jul. 25, 1986, Pat. No. 4,667,267, which is a continuation-in-part of Ser. No. 811,673, Dec. 20, 1985, Pat. No. 4,626,958, which is a continuation of Ser. No. 693,189, Jan. 22, 1985, abandoned.

[51] Int. Cl.⁴ .................. H01G 1/14; H01G 4/10; H05K 7/10
[52] U.S. Cl. ..................... 361/306; 361/321; 361/403; 174/52 FP
[58] Field of Search ............. 361/306, 321, 402–404, 361/328, 329, 433; 174/52 FP

[56] References Cited

U.S. PATENT DOCUMENTS

| | | | |
|---|---|---|---|
| 3,264,709 | 8/1966 | Lupfer | 361/321 X |
| 3,271,507 | 9/1966 | Elliott | 361/403 X |
| 3,349,481 | 10/1967 | Karp | 174/52 FP X |
| 3,617,817 | 11/1971 | Kawakatsu et al. | 174/52 FP X |
| 4,385,342 | 5/1983 | Puppolo et al. | 361/433 |
| 4,494,169 | 1/1985 | Watson | 361/306 |

*Primary Examiner*—Donald A. Griffin
*Attorney, Agent, or Firm*—Fishman & Dionne

[57] ABSTRACT

High frequency noise is decoupled from power supplied to Pin Grid Array (PGA), surface mounted leaded chip carrier and surface mounted leadless chip carrier packages by insertion of a decoupling capacitor between the PGA or leaded chip carrier package and printed circuit board; or by mounting the decoupling capacitor over a leadless chip carrier package. The decoupling capacitor comprises a multi layer capacitive element sandwiched between a pair of conductors and having a plurality of leads extending from each conductor. In accordance with the present invention, the decoupling capacitor is individually dimensioned and configured to fit under a PGA or leaded chip carrier package, or over a leadless chip carrier package; and correspond to the power and ground pin or lead configuration of that PGA, surface mounted leaded chip carrier and surface mounted leadless chip carrier package.

40 Claims, 46 Drawing Figures

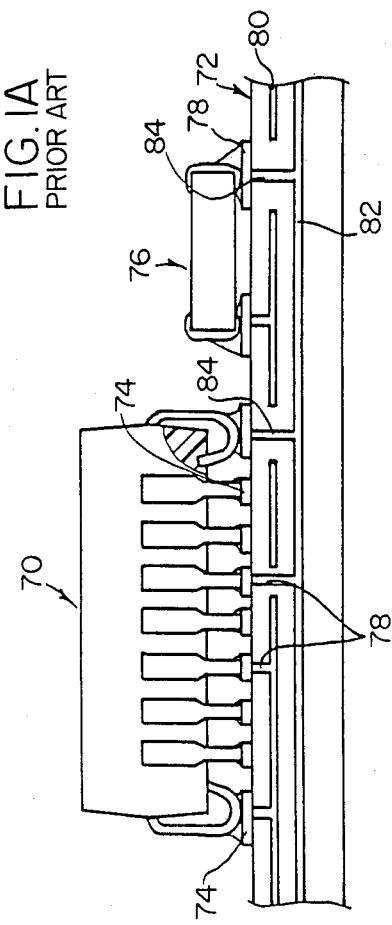
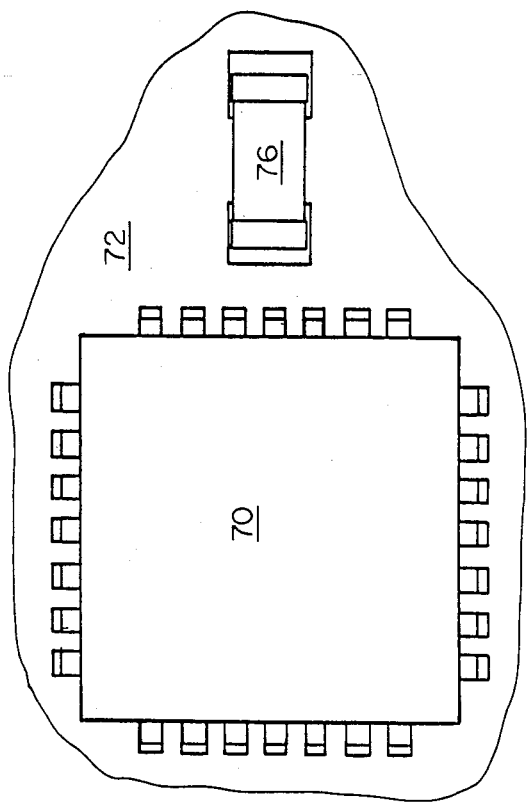
FIG. 1A PRIOR ART
FIG. 1B PRIOR ART

FIG. IC
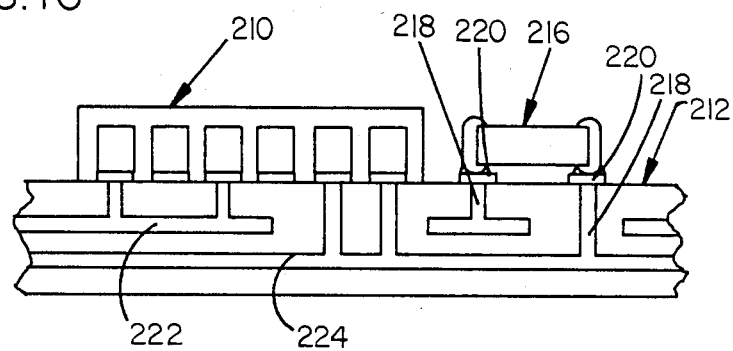
FIG. ID
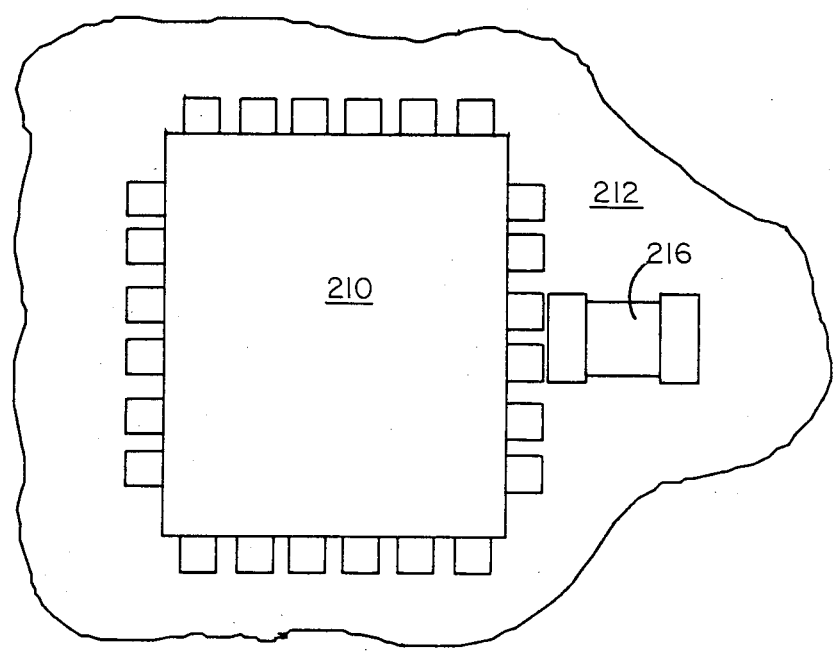

FIG. 2A
PRIOR ART
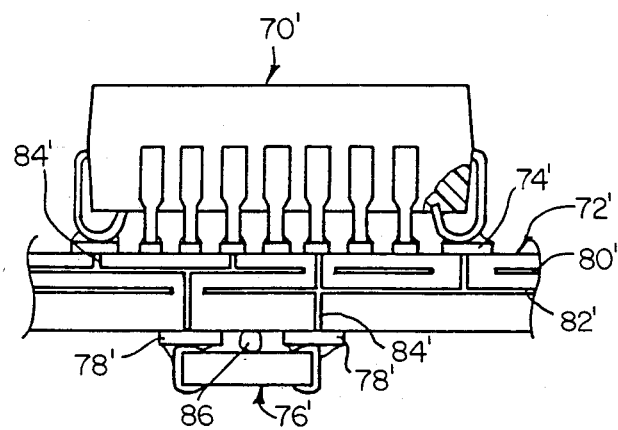
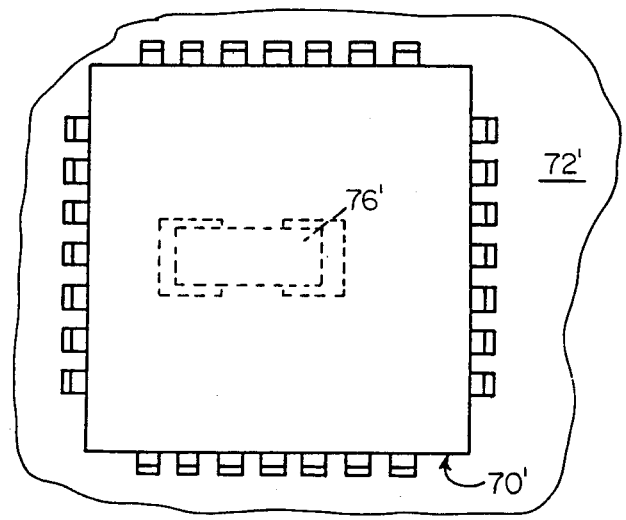
FIG. 2B
PRIOR ART

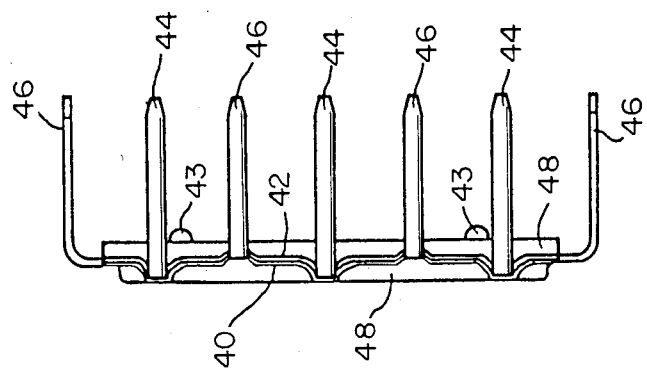
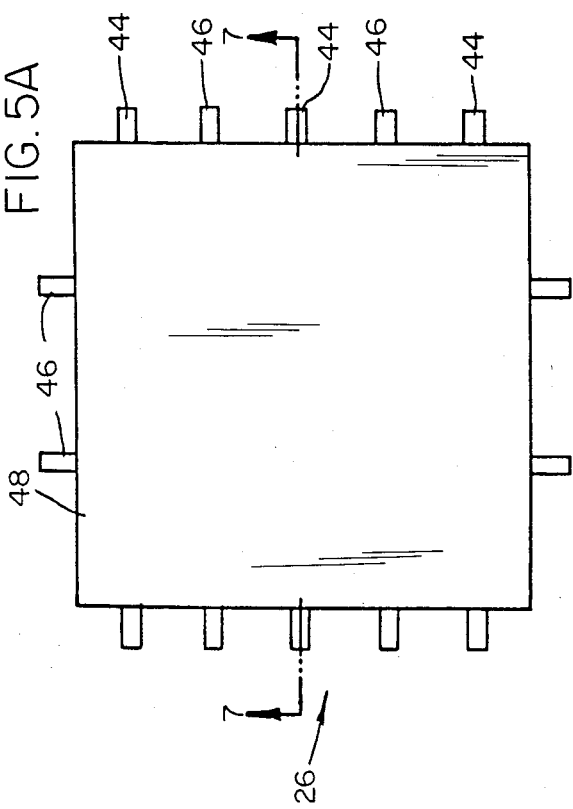

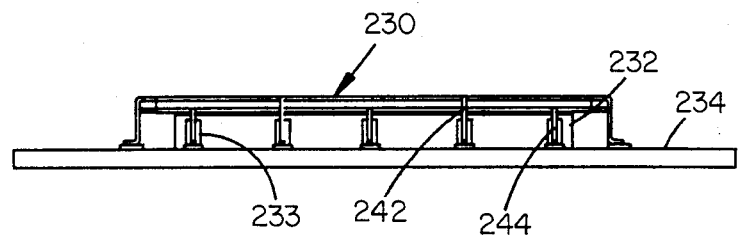
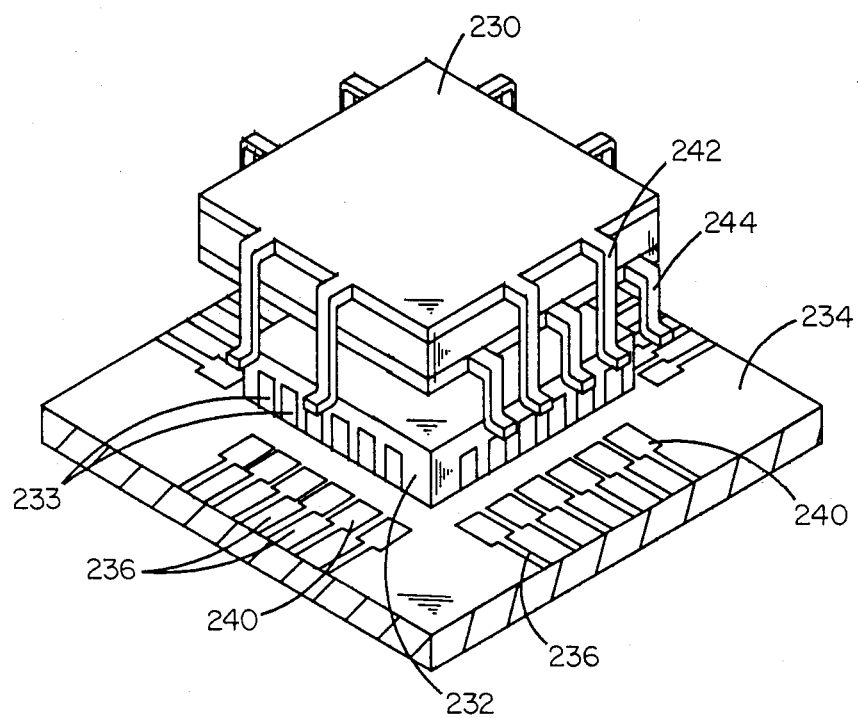

DECOUPLING CAPACITOR FOR SURFACE MOUNTED LEADLESS CHIP CARRIERS, SURFACE MOUNTED LEADED CHIP CARRIERS AND PIN GRID ARRAY PACKAGES

CROSS-REFERENCE TO RELATED APPLICATION:

This application is a continuation-in-part of U.S. application Ser. No. 890,489 filed July 25, 1986, now U.S. Pat. No. 4,667,267, which in turn, is a continuation-in-part of U.S. application Ser. No. 811,673 filed Dec. 20, 1985, now U.S. Pat. No. 4,626,958 issued Dec. 2, 1986, which, in turn, is a continuation of U.S. application Ser. No. 693,189 filed Jan. 22, 1985, now abandoned.

BACKGROUND OF THE INVENTION

This invention relates to the field of decoupling capacitors for integrated circuits. More particularly, this invention relates to novel and improved decoupling capacitors especially suitable for use in conjunction with Pin Grid Array (PGA) type integrated circuit packages and surface mounted leaded or leadless chip carrier packages for surface mounting integrated circuits.

It is well known in the field of microelectronics that high frequency operation, particularly the switching of integrated circuits, can result in transient energy being coupled into the power supply circuit. Generally, the prevention of the coupling of undesired high frequency noise or interference into the power supply for an integrated circuit is accomplished by connecting a decoupling capacitor between the power and ground leads of the IC. One connection scheme utilizes a capacitor which is mounted on a multilayer printed circuit board, outside the integrated circuit with plated through holes used to connect the capacitor to the internal power and ground planes, which in turn make contact with the power supply connection leads of the integrated circuit. A less preferred method (in terms of higher inductance) is to interconnect the decoupling capacitor and integrated circuit power and ground leads via traces on either a multilayer or double sided printed circuit board.

The above two decoupling techniques suffer from several deficiencies. The most serious of these deficiencies resides in the fact that the circuits, including the capacitors, become highly inductive at high frequencies as a consequence of the shape and length of the leads and interconnection traces between the discrete capacitor and the integrated circuit which it decouples. In fact, the inductance of the leads and printed circuit board traces may be sufficiently high to nullify the high frequency effect of the capacitor in the circuit. A second serious deficiency resides in the spatial inefficiency incident to employing a capacitor adjacent to the integrated circuit. The space requirements i.e., real estate, of the decoupling capacitor and the interconnection traces on the printed circuit board adversely affect the optimum component packaging density which can be achieved on the board.

In an effort to overcome the above-discussed deficiencies associated with the use of decoupling capacitors mounted on a printed circuit board, a decoupling capacitor which is adapted to be mounted underneath a conventional dual-in-line circuit has been proposed. U.S. Pat. No. 4,502,101 (which is assigned to the assignee hereof, and the entire contents of which are incorporated herein by reference) discloses a decoupling capacitor for an integrated circuit package. The decoupling capacitor of that prior patent is a thin rectangular chip of ceramic material which is metallized on opposite sides and has two electrically active leads from the metallized coatings on opposite sides of the chip at two points adjacent a pair of diagonally opposed corners of the rectangularly shaped ceramic chip. The capacitor may also contain two or more electrically inactive dummy leads. The two active (and dummy) leads are bent downwardly, and the decoupling capacitor assembly is encapsulated in a film of nonconductive material. In accordance with the teachings of that prior patent, the decoupling capacitor is dimensioned so as to be received in the space between the two rows of leads extending from a conventional dual-in-line integrated circuit. The two electrically active leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two electrically active capacitor leads have been inserted.

U.S. Pat. No. 4,636,918, which is also assigned to the assignee hereof and incorporated herein by reference, discloses a decoupling capacitor of the type described in U.S. Pat. No. 4,502,101 and which is similarly mounted in the same through holes as the power and ground supply conductors of the DIP integrated circuit package. However, in contrast to the assembly shown in U.S. Pat. No. 4,502,101, the decoupling capacitor of U.S. Pat No. 4,636,918 is mounted either over the integrated circuit package; or on the opposed side of the circuit board (relative to the IC package) in alignment with the integrated circuit package.

While suitable for its intended purposes, the decoupling capacitors described in U.S. Pat. Nos. 4,502,101 and 4,636,918 are not particularly adapted to be used in conjunction with Pin Grid Array (PGA) type integrated circuit packages or either leaded or leadless surface mounted chip carrier type integrated circuit packages. PGA packaging and surface mounted plastic chip carriers (of the leaded or leadless type) are becoming a commonly used IC packaging technology. As with conventional dual-in-line packages, PGA packages and surface mounted plastic chip carriers (of the leaded or leadless type) require similar decoupling across the power and ground leads. However, decoupling capacitors of the type disclosed in the above-discussed patents have a structure and configuration which preclude their usage in conjunction with the distinctive configuration of well known PGA packages.

SUMMARY OF THE INVENTION

The above-discussed deficiencies and drawbacks of prior art decoupling capacitors are overcome or alleviated by the novel decoupling capacitor of the present invention. In accordance with the present invention, a flat decoupling capacitor adapted for mounting directly under a Pin Grid Array package and a surface mounted plastic leaded chip carrier, respectively; or over a surface mounted leadless chip carrier, is provided which will result in a lower decoupling loop, thus providing a more effective decoupling scheme. The capacitors of the present invention also contribute to a savings in board space, i.e., takes up less "real estate" on the printed circuit board, by resting entirely under either the PGA package or the surface mounted leaded chip carrier, or over the leadless chip carrier.

In an effort to achieve higher capacitance values and increased temperature stability, several embodiments of the present invention are described which utilize one or more multilayer capacitive elements sandwiched between a pair of conductors rather than a single layer of dielectric material. Also, several types of multilayer ceramic capacitor elements are disclosed which provide a low induction parallel-plate type capacitive structure. The decoupling capacitor assemblies of the present invention are specifically sized and configured so as to be either received in the space directly below the integrated circuit chip and between the downwardly extending pins of a PGA package or leaded chip carrier package, or to be mounted directly over a leadless chip carrier package. It is well known that PGA packages and surface mounted chip carriers have many different types of pin or lead configurations. Accordingly, the present invention has flexible lead locations and multiple pins from each voltage level of the PGA, leaded or leadless chip carrier so as to be tailored to a particular PGA, leaded or leadless chip carrier package.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 1A is a side elevation view of a "leaded" surface mounted IC chip carrier package connected to a ceramic capacitor via plated through holes and internal planes in accordance with the prior art.

FIG. 1B is a plan view of the IC package and capacitor arrangement shown in FIGURE 1A;

FIG. 1C is a side elevation view of a "leadless" surface mounted IC chip carrier package connected to a ceramic capacitor via plated through holes and internal planes in accordance with the prior art;

FIG. 1D is a plan view of the IC package and capacitor arrangement shown in FIGURE 1C;

FIG. 2A is a side elevation view of a "leaded" surface mounted IC chip carrier package connected to a ceramic capacitor on the backside of a printed circuit board in accordance with the prior art;

FIG. 2B is a plan view of the IC package and capacitor arrangement shown in FIG. 2A;

FIG. 5A is a plan view of a decoupling capacitor for use in conjunction with a Pin Grid Array package in accordance with the present invention;

FIG. 5B is a side elevation view along the line B—B of FIG. 5A.

FIG. 5C is a side elevation view along the line C—C of FIG. 5A.

FIG. 19 is a perspective view of the decoupling capacitor of FIGS. 17 and 18;

FIG. 27 is a side elevation view showing a decoupling capacitor mounted over a leadless surface mounted chip carrier; and FIG. 28 is an exploded perspective view showing the assembly of FIG. 27.

DESCRIPTION OF THE PREFERRED EMBODIMENT

Figure 1:
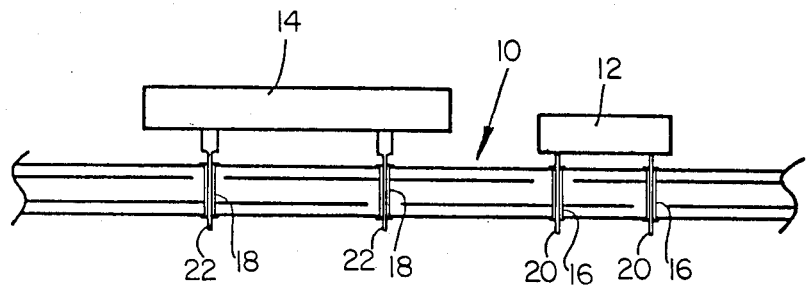
FIG. 1 is a side view of a Pin Grid Array package connected to a multilayer ceramic capacitor via plated through holes and internal planes in accordance with the prior art.
Figure 2:
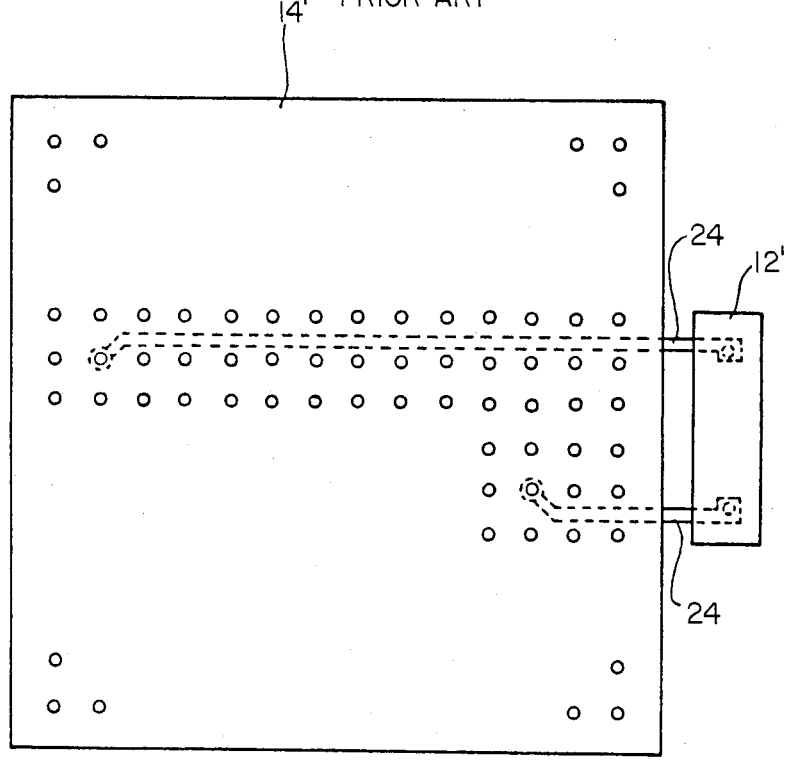
FIG. 2 is a plan view of a Pin Grid Array package connected to a multilayer ceramic capacitor via printed circuit traces in accordance with the prior art.

Referring first to prior art FIG. 1, a multilayer printed circuit board 10 is shown having a multilayer ceramic capacitor 12 and a Pin Grid Array (PGA) package 14 mounted thereon. Capacitor 12 is mounted outside PGA package 14 and plated through holes 16 and 18 are used to connect the capacitor leads 20 to the power and ground leads 22 of the PGA package 14. Prior art FIG. 2 shows a less effective decoupling scheme wherein printed circuit traces 24 are used to connect power and ground leads of the PGA package 14' with the decoupling capacitor 12'.

As discussed earlier, the prior art decoupling schemes of FIGS. 1 and 2 both suffer from serious deficiencies and drawbacks including high inductance in the leads and printed circuit board traces (especially in the FIG. 2 assembly) as well as inefficient use of board real estate which adversely affects component packaging density.

Figure 3:
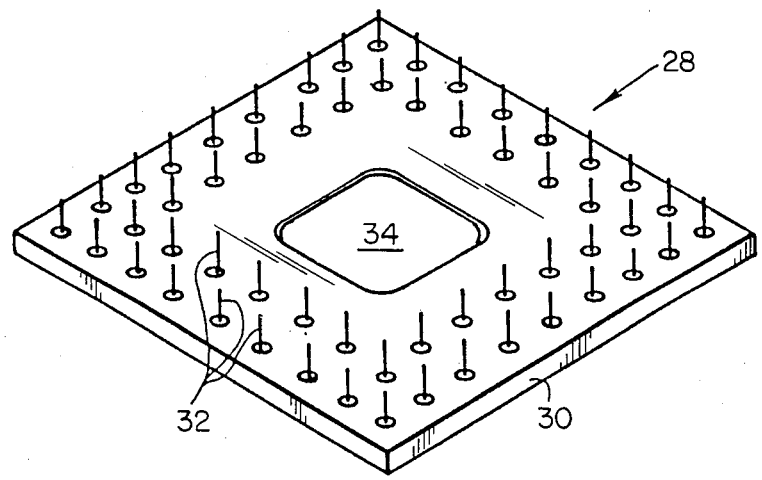
FIG. 3 is a perspective view of pin Grid Array package.
Figure 4:
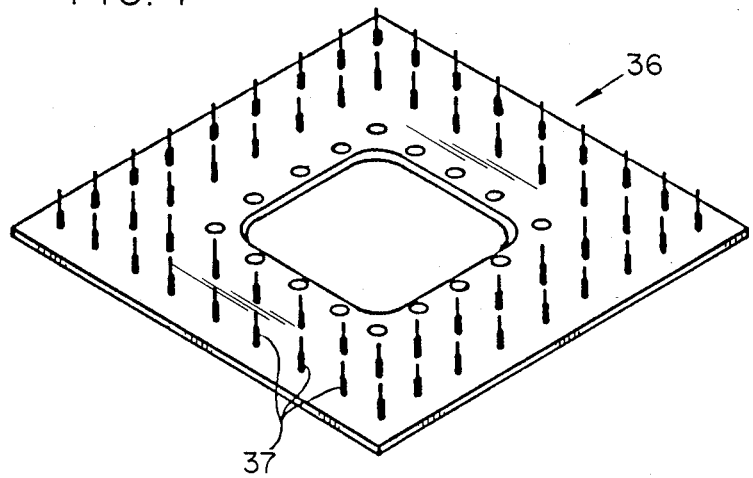
FIG. 4 is a plan view of a pin Grid Array socket.

These important problems are overcome by the decoupling capacitor of the present invention which is dimensioned and configured specifically to be used in conjunction with Pin Grid Array packages. Referring first to FIGS. 3 and 4, a typical PGA package is shown generally at 28. Pin Grid Array package such as that shown in FIGS. 3 and 4 are well known to those skilled in the art and comprise a square or rectangular base portion 30 having a plurality of pins 32 in an array or pattern extending therefrom. The pins may be of several types including signal pins, power and ground pins and alignment pins. Generally, the power and ground pins 32 of PGA package 28 are located about the inner periphery of the pin array (i.e., the inner rings of pins) and surround the center area 34. The center of the PGA package has no pins extending therefrom and is defined as the chip cavity area 34. Chip cavity area 34 receives an integrated circuit chip (not shown) to complete the PGA package. It is well known that the pin configuration and overall sizing of PGA packages may differ significantly from one part to the next depending upon the particular electronic requirements. It will be appreciated then, that while a PGA package having two concentric rows of pins is shown in FIG. 3, a PGA package may have (and usually does have) more concentric rows of pins.

The PGA package 28 of FIG. 3 may be mounted (i.e., soldered) either directly on a printed circuit board or may be preliminary mounted in a socket 36 (FIG. 4) prior to circuit board mounting. Socket 36 includes a plurality of pin sockets 37 which correspond to pins 32 and are adapted for receiving pins 32 therein.

It will be appreciated that the decoupling capacitor of the present invention is dimensioned and configured to be mounted under a PGA package (such as the one shown in FIG. 3) in the chip cavity area either under a socket or directly under a soldered package as will be discussed in more detail below with reference to FIGS. 9A and 9B.

Turning now to FIGS. 5A-5C and 7, a decoupling capacitor in accordance with the present invention is shown generally at 26. Decoupling capacitor 26 is comprised of a dielectric material or dielectric chip 38 (see FIG. 7) sandwiched between a pair of metal conductors 40 and 42. Each conductor 40, 42 has a plurality of leads 44 and 46 which are connected thereto and extend outwardly therefrom. The leads extend outwardly a short distance and then are bent downwardly so as to extend in a direction which is perpendicular to the planes of the conductors. The entire assembly, with the exception of the plural transversely extending lead portions are then encapsulated within a suitable nonconductive material 48. The encapsulation may be laminated insulation, a molded process or any other applicable method. The conductors 40, 42 may vary in thickness and in alloy content. The dielectric 38 may be comprised of any suitable dielectric material, preferably ceramic. Preferably, a pair of stand off 43 are formed in encapsulation 48 to permit cleaning between the decoupling capacitor and circuit board.

The decoupling capacitor 26 of FIGS. 5A-5C include a total of 14 leads 44, 46, six (6) leads 44 being connected to one conductor 40 (voltage conductor), and eight (8) leads 46 being connected to the other conductor 42 (ground conductor). However, it will be appreciated that FIGS. 5A-5C describe only one particular lead configuration which is suitable for one (or more) particular Pin Grid Array package and its unique power pin configuration. As mentioned earlier, the dimensions and pin configurations of PGA packages can differ significantly from package to package. Accordingly, an important feature of the decoupling capacitor of the present invention is that it may be easily tailored to be used in conjunction with any PGA package. For example, in FIGS. 6A-6C, an alternative embodiment of a decoupling capacitor is shown at 26'. Capacitor 26' has the same parallel plate capacitor structure of a dielectric material sandwiched between two conductors as does capacitor 26.

Figure 6B:
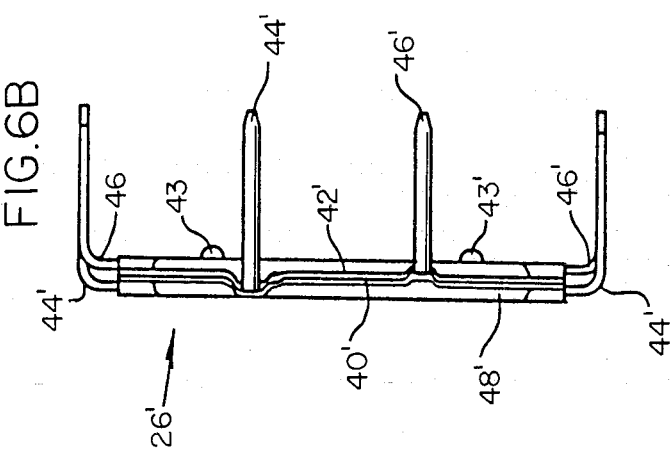
FIG. 6B is a side elevation view along the line B—B of FIG. 6A.
Figure 6A:
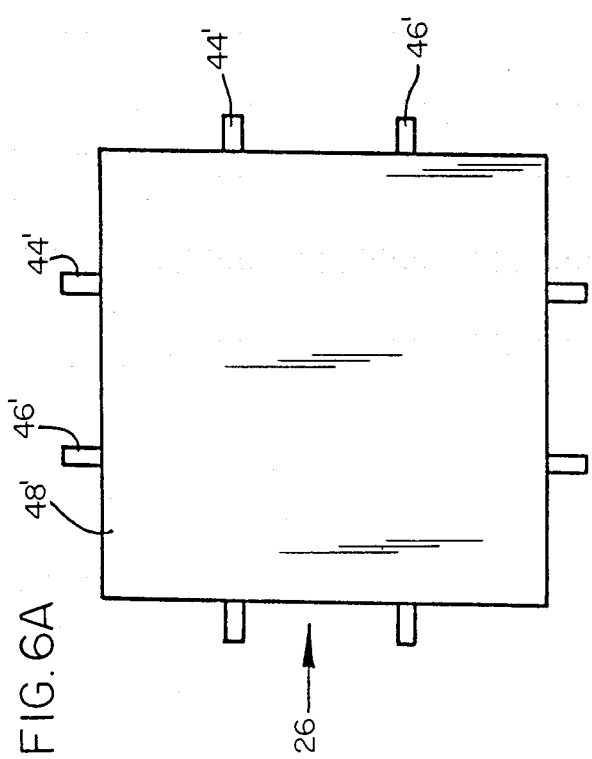
FIG. 6A is a plan view, similar to FIG. 5A, of another embodiment of a decoupling capacitor in accordance with the present invention.
Figure 6C:
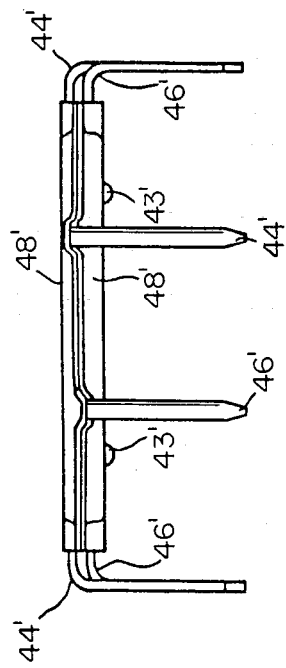
FIG. 6C is a side elevation view along the line C—C of FIG. 6A.
Figure 7:
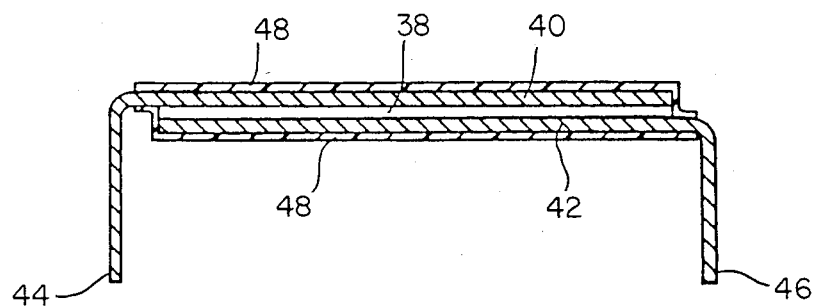
FIG. 7 is a cross-sectional elevation view along the line 7—7 of FIG. 5A.

However, unlike FIGS. 5A-5C, the decoupling capacitor 26' of FIGS. 6A-6C includes a total of 8 leads 44' and 46', four (4) leads being connected to each conductor. Also, the outer dimensions of capacitor 26' may differ from the outer dimension of capacitor 26 depending upon the dimensions of the PGA package which is being used in conjunction therewith.

Figure 8A:
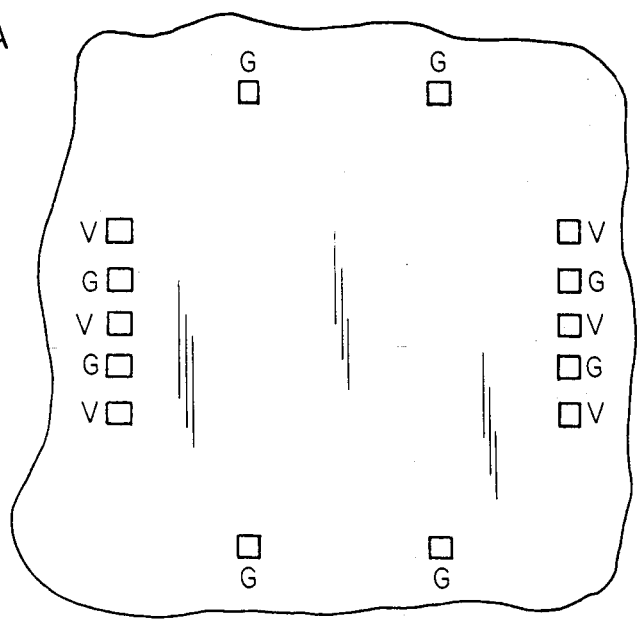
FIG. 8A is a pin designation of the inside pins of the Pin Grid Array package similar to the Pin Grid Array package of FIG. 3.
Figure 8B:
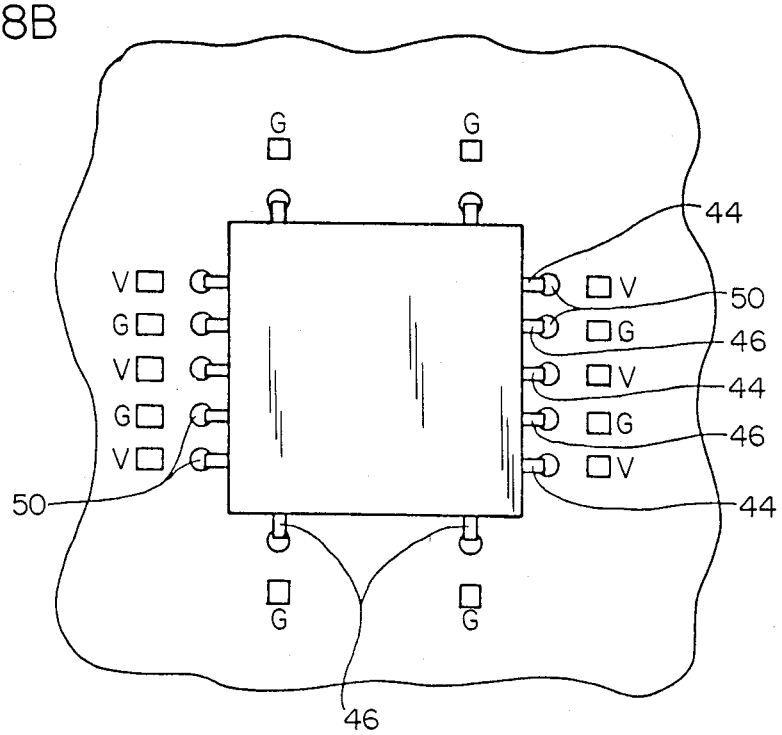
FIG. 8B is a pin designation of the decoupling capacitor of FIG. 5A connected to the inner perimeter of pins of the Pin Grid Array package of FIG. 3A.

As mentioned, the lead configuration of the decoupling capacitor of the present invention will be adapted to suit the particular needs of a selected PGA package power pin configuration. In FIG. 8A, a pin designation of the power pin configuration of a PGA package for use with the decoupling capacitor 26 of FIGS. 5A-5C is shown. FIG. 8A is thus representative of the pin configuration along the inner perimeter of pins of a PGA package such as the one described in FIG. 3. Each box in FIG. 8A represents a pin while the symbol "G" or "V" indicates whether the pin is power (voltage) or ground. Referring now to FIG. 8B, a decoupling capacitor 26 of FIGS. 5A-5C has now schematically been provided to the printed circuit board via additional holes 50. Each lead 44, 46 from capacitor 26 is matched with a corresponding voltage or ground pin from the PGA package to provide decoupling thereto. It should be understood that eight (8) leads 46 from capacitor 26 are connected to a ground conductor while the other six (6) leads 44 are connected to the voltage conductor in the capacitor.

Figure 9B:
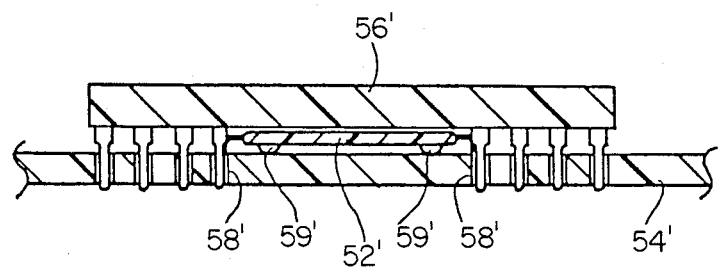
FIG. 9B is a cross-sectional elevation view, similar to FIG. 9A, of an alternative method of mounting the decoupling capacitor of the present invention.
Figure 9A:
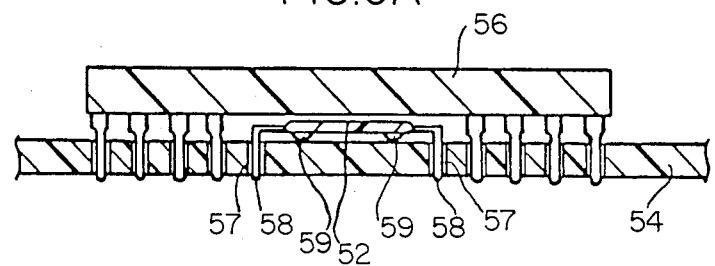
FIG. 9A is a cross-sectional elevation view of the decoupling capacitor of the present invention mounted underneath a Pin Grid Array package on a circuit board.

Referring now to FIG. 9A, the decoupling capacitor 52 of the present invention is shown mounted on a printed circuit board 54 underneath a PGA package 56. PGA package 56 is similar to PGA package 28 of FIG. 3, however, the PGA package 28 of FIG. 3 has been flipped over so that the pins extend downwardly through the printed circuit board 54. As discussed, enough space in the chip cavity area of the PGA package remains for the decoupling capacitor 52 of the present invention to be placed thereunder. In FIG. 9A, separate holes 57 have been provided in the circuit board 54 for receiving leads 58 therein. It will be appreciated that the leads of capacitor 52 and pins of PGA package 56 are connected either by plated through holes in a multilayer circuit board or by relatively short traces. As mentioned, the present invention is preferably provided with standoffs 59 which permit cleaning between the circuit board 54 and decoupling capacitor 52.

Turning now to FIG. 9B, an alternative method of mounting the decoupling capacitor of the present invention is shown. In FIG. 9B, the leads of capacitor 52' and pins of PGA package 56' share a circuit board hole. This method of mounting may be preferable to that shown in FIG. 9A as no additional holes need be provided to the printed circuit board 54'.

Figure 10A:
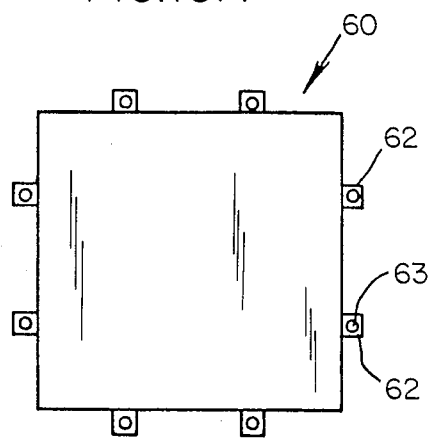
FIG. 10A is a plan view of another embodiment of a decoupling capacitor in accordance with the present invention.
Figure 10B:
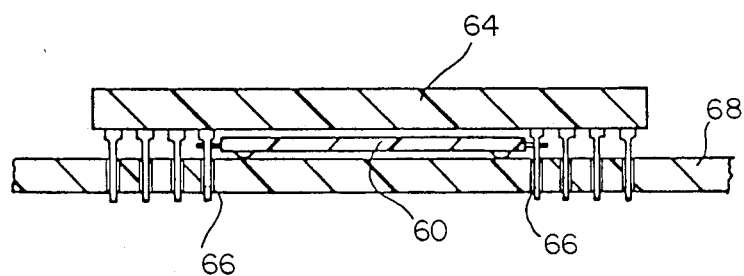
FIG. 10B is a cross-sectional elevation view of the decoupling capacitor of FIG. 10A mounted underneath a Pin Grid Array package on a circuit board.

An alternative lead configuration to that discussed heretofore is shown in the decoupling capacitor 60 of FIGS. 10A and 10B. Decoupling capacitor 60 has the same structure as those described earlier except that leads 62 are formed as extended tabs, each tab having an opening 63 therethrough for receiving the pin 66 of a PGA package 64. Decoupling capacitor 60 may thus be mounted on pins 66 of PGA package 64 prior to installation on printed circuit board 68 which may ease assembly and permit the use of automatic insertion equipment.

The decoupling capacitor for use in conjunction with Pin Grid Array packages of the present invention has many features and advantages not found in the prior art. For example, by mounting a flat decoupling capacitor directly under a PGA package, the result will be a lower inductance decoupling loop, thus providing a more effective decoupling scheme. This alleviates many of the problems associated with the high inductance of the prior art decoupling schemes of FIGS. 1 and 2.

The present invention also permits a reduction in the amount of circuit board "real estate" occupied by the prior art decoupling devices of FIGS. 1 and 2. The need to save circuit board space to permit higher component mounting density is presently an important concern to those skilled in the art of electronic circuit design. Accordingly, the present invention addresses this problem by employing the novel mounting of decoupling capacitors underneath PGA packages.

While well suited for its intended purposes, the decoupling capacitor for PGA packages as shown in FIGS. 5A-C, 6A-C and 7 which utilize a single layer capacitive element sandwiched between two parallel plates does suffer from certain drawbacks. For example, the use of a single layer capacitive element severely limits the total capacitance of the decoupling device. Also, when attempting to achieve higher capacitance values, the temperature stability of the decoupling capacitor is adversely affected as those dielectric materials which provide higher capacitance are typically unstable as temperature increases. It will be appreciated that those dielectric materials which are stable at higher temperatures do not provide a high capacitance needed for decoupling purposes.

An advantage of the decoupling capacitors of FIGS. 5A-C, 6A-C and 7 is the parallel plate type construction. The use of "parallel plate" constructions inherently have the lowest inductive effects. As previously mentioned, inductive effects have a severely detrimental effect on the high frequency performance of a decoupling device.

The above described deficiencies of the single layer capacitors are overcome with the decoupling capacitors of FIGS. 17-23 which incorporate at least one multilayer capacitor element therein for increased capacitance and temperature stability. Significantly, the multilayer capacitor devices of FIGS. 17-23 preferably retain the parallel plate-type construction of the single layer capacitors thereby insuring a low inductance.

While many different constructions for multilayer capacitive elements (including both parallel plate and non-parallel plate constructions) may be utilized in conjunction with the present invention, several preferred configurations are shown in FIGS. 11-16. In all of these preferred constructions, the multilayer capacitive element is a multilayer ceramic capacitor with externally accessible parallel plane electrodes (in contrast to conventional multilayer ceramic capacitors having external electrodes along the respective ends of the ceramic body).

Figure 11:
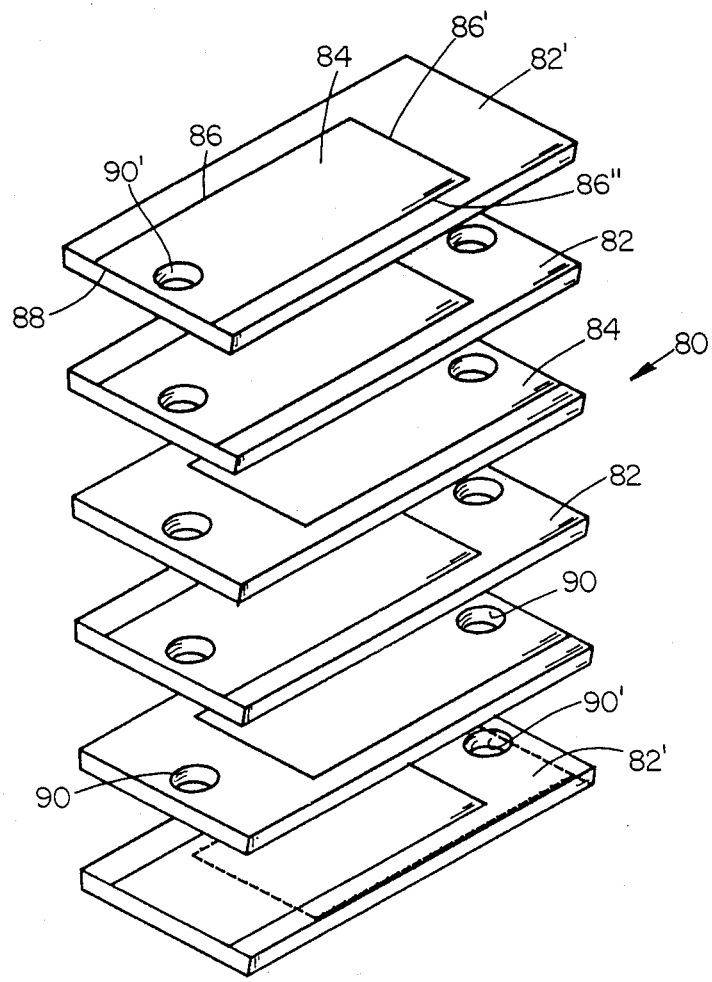
FIG. 11 is an exploded perspective view of a multilayer capacitor (MLC) chip in accordance with a first embodiment of the present invention.
Figure 12:
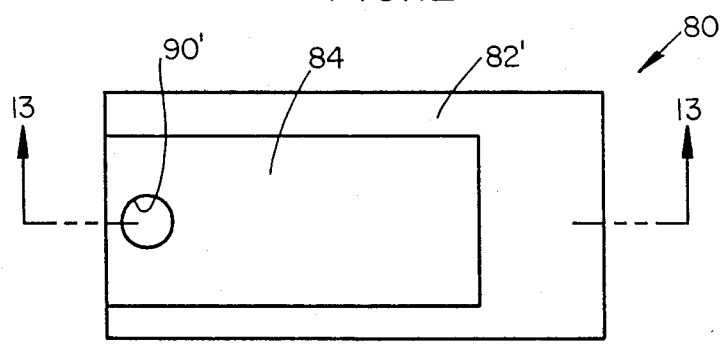
FIG. 12 is a plan view of the MLC of FIG. 11.
Figure 13:
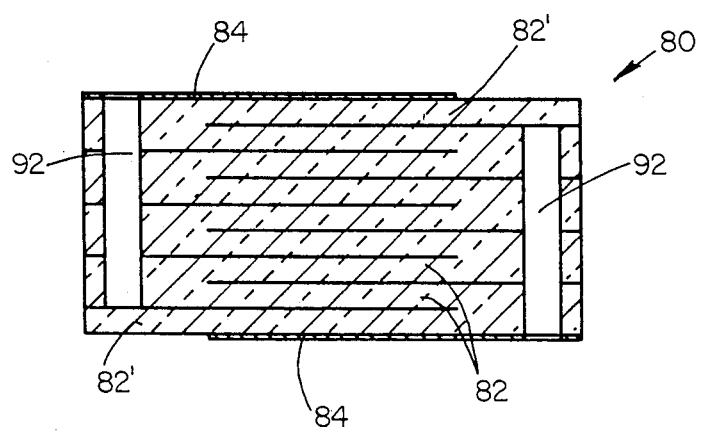
FIG. 13 is a cross-sectional elevation view along the line 13—13 of FIG. 12.

Referring jointly to FIGS. 11-13, a multilayer ceramic capacitor (MLC) is shown generally at 80. MLC 80 is comprised of a plurality of ceramic layers 82 and 82' having a conductive (metallic) electrode 84 printed thereon. Preferably, three sides 86, 86' and 86" of electrode 84 terminate inwardly of each planar ceramic layer 82 or 82' with the fourth side or end 88 co-terminating with the edge of ceramic layer 82. The inner ceramic layers 82 each have a pair of oppositely disposed openings 90 therethrough for a via connection. The two outer (top and bottom) layers 82' each have only one opening 90' with the opening in the top layer being oppositely disposed from the opening in the bottom layer. As shown in FIG. 13, assembled multilayer ceramic capacitor 80 is a series of stacked ceramic layers interleaved with conductive electrodes; with alternating electrodes being electrically connected by via interconnections 92. The top and bottom ceramic layers 82' each have exposed conductive electrodes 84.

In FIGS. 14 A-D, a second embodiment of a multilayer ceramic capacitor for use in the present invention is shown. Referring first to FIG. 14A, a multilayer ceramic capacitor 92 is assembled in a manner similar to the MLC of FIGS. 11-13. Thus, a plurality of layers of ceramic material 94 are interleaved with electrode layers 96; with alternating electrodes being electrically connected along either end 98 and 100. However, in contrast to the MLC of FIGS. 11-13, MLC 92 has upper and lower ceramic layers 94' which are substantially thicker than inner ceramic layers 94. The presence of thicker upper and lower layers is important in providing room for the removal of a portion of each layer as will be described hereinafter.

Figure 14A:
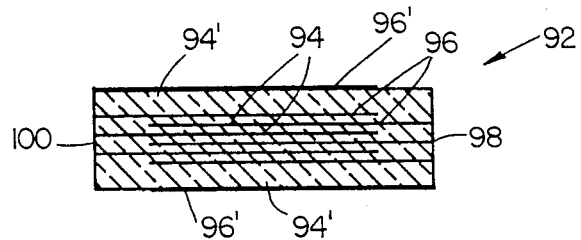
FIGS. 14A–14D are cross-sectional elevation views of a multilayer capacitor chip in accordance with a second embodiment of the present invention.
Figure 14B:
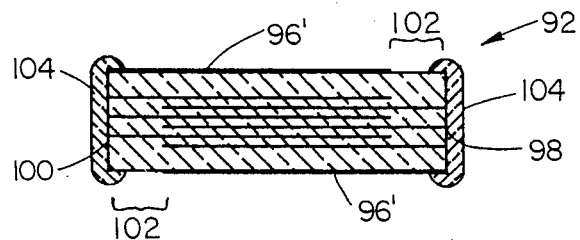

In an effort to avoid electrical shortening across the gap 102 defined between the top and bottom electrodes 96' and end electrodes 98 and 100, each end is provided with an insulating sheath 104 as shown in FIG. 14B.

Sheath 104 may be comprised on any suitable electrically insulative material such as epoxy or glass.

Figure 14C:
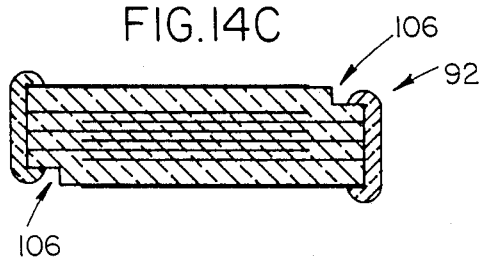
Figure 14D:
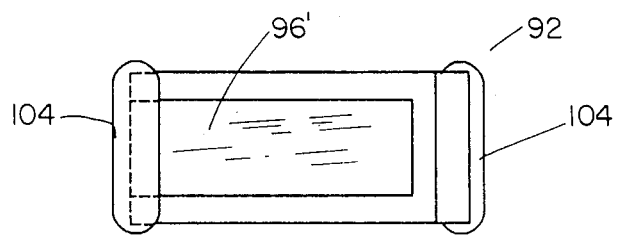

Referring to FIGS. 14C and 14D, a portion of the end termination is partially removed at opposed diagonal corners of MLC 92 as identified at 106. The partial removal of sections 106 may be accomplished with an appropriate abrasion method. The final MLC construction with the removed sections 106 further eliminates any risk of electrical bridging of gap 102 of FIG. 14B.

Figure 15:
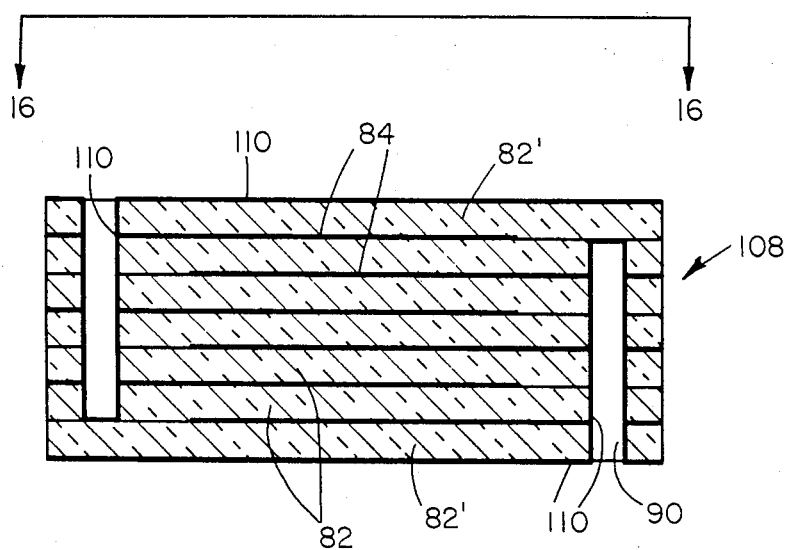
FIG. 15 is a cross-sectional elevation view of a multilayer capacitor chip in accordance with a third embodiment of the present invention.
Figure 16:
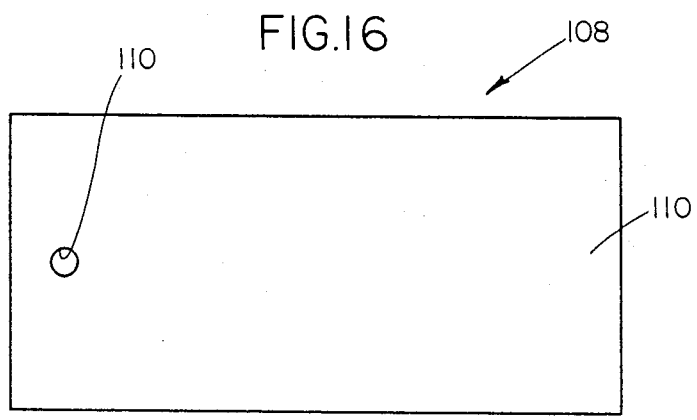
FIG. 16 is a plan view along the line 16—16 of FIG. 15.

In FIGS. 15 and 16, a MLC is shown generally at 108 and is similar to MLC 80 of FIGS. 11-13. Thus, MLC 108 is comprised of a plurality of ceramic layers 82 and 82' having a conductive (metallic) electrode 84 printed thereon. The inner ceramic layers each have a pair of oppositely disposed openings 90 therethrough for a via connections. The outer (top and bottom) layers 82' each have only one opening 90' with the opening in the top layer being oppositely disposed from the opening in the bottom layer. In contrast to MLC 80, MLC 108 includes an electroless nickel plating layer 110 on the top and bottom ceramic layers 82' and in holes 90. In a preferred method of making MLC 108, ceramic layers with electrodes printed thereon are stacked up, the organic binders are burned off and the stack up is sintered (fired). The stack up is then electroless nickel plated and finally individual chips (MLC's) are separated by diamond sawing or other suitable process.

All three configurations of multilayer capacitor chips shown in FIGS. 11-16 have in common a "parallel plate" construction which leads to low inductance. The significant advantages of such "parallel plate" type multilayer capacitor chips are discussed in greater detail in corresponding U.S. application Ser. No. 839,636 filed Mar. 14, 1986, assigned to the assignee hereof, all of the contents of which are incorporated herein by reference. It will be appreciated that while multilayer ceramic capacitor chips of the "parallel plate" type are preferred (particularly, the MLC identified at 80 in FIGS. 11-13), other multilayer capacitor chips may also be utilized in accordance with the decoupling capacitor for PGA packages of the present invention.

Figure 17:
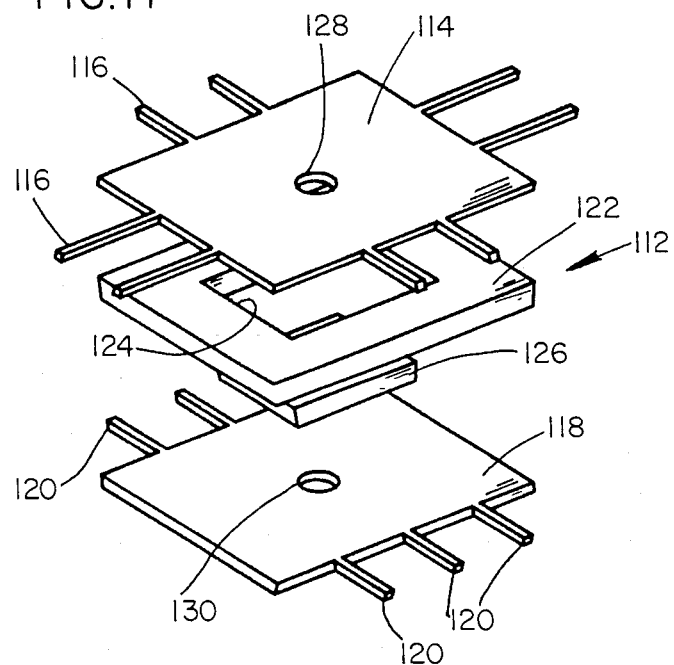
FIG. 17 is an exploded perspective view of a decoupling capacitor for a Pin Grid Array package incorporating a multilayer capacitor chip therein in accordance with the present invention.
Figure 18:
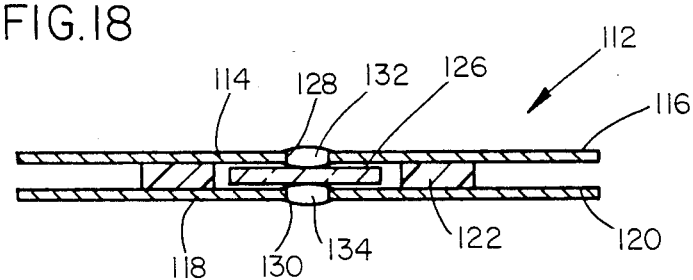
Figure 19:
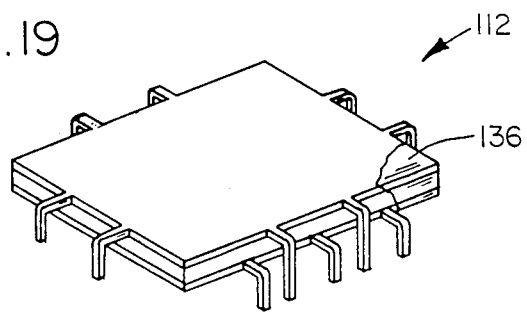
FIG. 19 is a cross-sectional elevation view of the decoupling capacitor of FIG. 17.

Turning now to FIGS. 17-19, a decoupling capacitor for PGA packages is shown generally at 112 which incorporates a multilayer capacitor chip therein. Decoupling capacitor 122 comprises a first conductor 114 having a plurality of first leads 116 extending therefrom at preselected locations along the periphery thereof and a second conductor 118 having a plurality of second leads 120 extending therefrom at preselected locations along the periphery thereof. An annular insulating spacer 122 is positioned between conductors 114 and 118. Insulating spacer 112 has an opening 124 therethrough for receiving a multilayer capacitor chip 126 such as one of the MLC chips shown in FIGS. 11-17. Holes 128 and 130 are respectively provided in conductors 114 and 118. Subsequent to assembly of the conductors 114, 118, insulating spacer 122 and multilayer capacitor chip 126, solder or any other suitable electrically conductive adhesive means as identified at 132 and 134 (conductive epoxy) are delivered to holes 128 and 130 to effect an electrical and mechanical connection between conductors 114 and 118. Thereafter, decoupling capacitor 112 is environmentally sealed with an encapsulate material 136 using any suitable and well known method and leads 116 and 188 are bent downwardly for through hole insertion. Alternatively, leads 116 and 118 may be formed for surface mounting.

Figure 20:
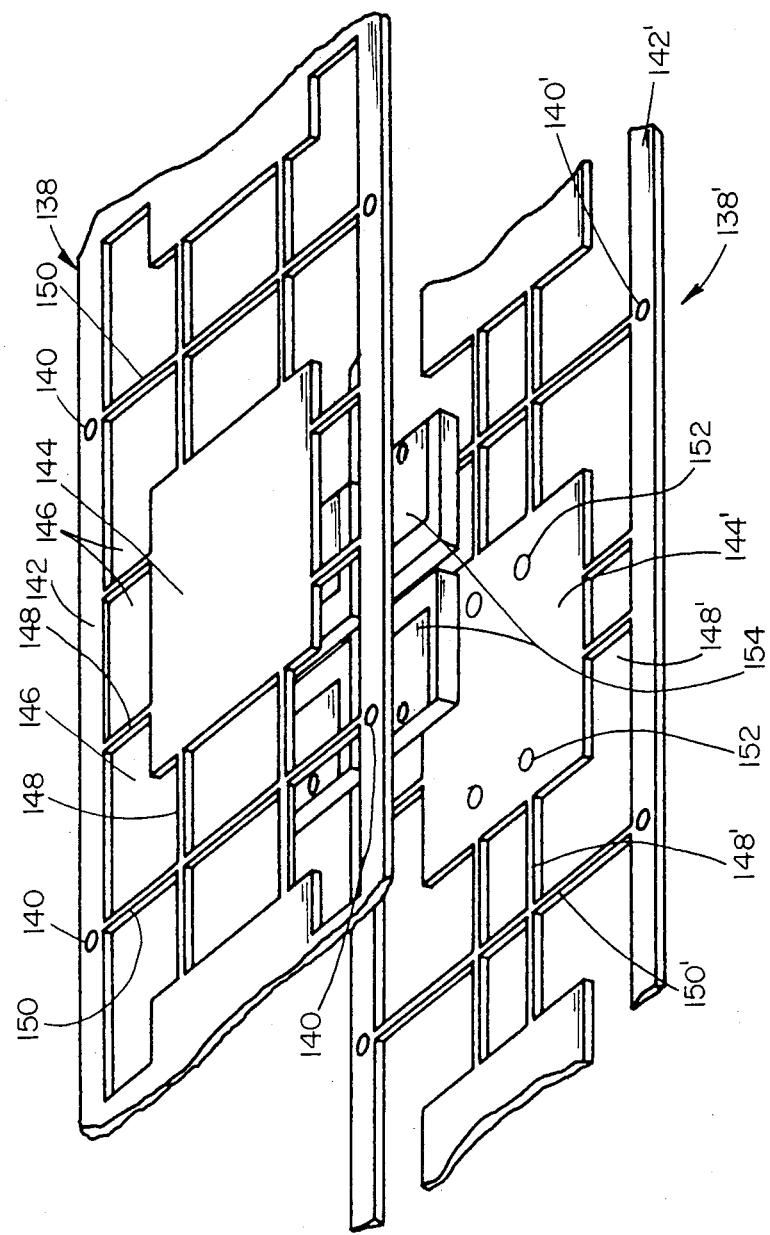
FIG. 20 is an exploded perspective view of another decoupling capacitor for a Pin Grid Array package incorporating a multilayer capacitor chip therein in accordance with the present invention.
Figure 21:
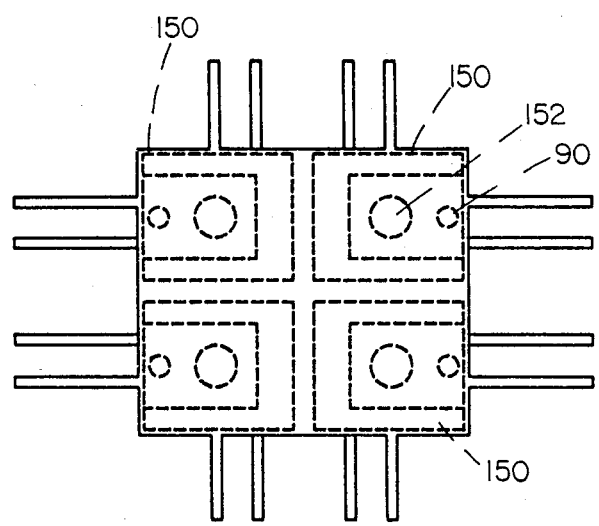
FIG. 21 is a plan view of the decoupling capacitor of FIG. 20.
Figure 22:
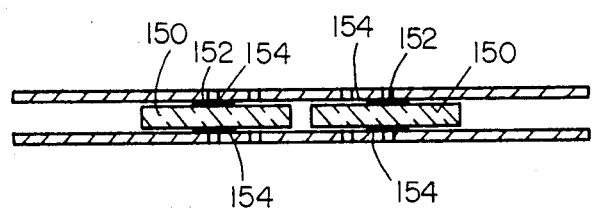
FIG. 22 is a cross-sectional elevation view of the decoupling capacitor of FIG. 20.

A preferred method of manufacturing PGA package decoupling capacitors incorporating multilayer chips is shown in FIGS. 20-23. Referring first to FIG. 20, a first or top lead frame used in accordance with the present invention is shown generally at 138. Top lead frame 138 is a continuous planar strip of conductive material i.e., copper, which is provided with openings 140 along opposed side edges or carrier strips 142 thereof for registration and transport. It will be appreciated that FIG. 20 shows only a small portion of a lead frame which is suitable for forming three decoupling capacitors in accordance with the present invention. It will further be appreciated that lead frame 138 is preferably a stamped part wherein all the components thereof are rigid. Thus, the desired lead frame configuration is formed by removing unwanted material from the strip of conductive material using any suitable and conventional technique.

Lead frame 138 includes a top conductor body portion 144 and is isolated from edge strips 142 by substantially rectangular openings 146. Conductor 144 includes a plurality of pins or leads 148 integrally attached thereto which are connected to either edge strips 142 or a lateral support member 150 running between edge strips 142.

Similarly, bottom lead frame 138' is a continuous planar strip of conductive material, i.e., copper, which is provided with openings 140' along opposed side edges or carrier strips 142' thereof for registration and transport. Bottom lead frame 138' also has a conductor 144' and includes a plurality of pins appreciated that conductors 144 and 144' are supported within lead frames 138 and 138', i.e., on edge portions 142 and 142' by leads 148 and 148' and lateral support members 150 and 150' respectively. Finally, lead frames 138, 138' may also include stand-off means 59, 59' (FIGS. 9A and 9B), i.e., dimples for spacing back the decoupling capacitor from the circuit board.

Referring jointly to FIGS. 20-23, lead frames 138 and 138' as described hereinabove sandwich therebetween at least one, and preferably more than one, multilayer capacitor chip. In the particular embodiment shown, four (4) multilayer ceramic capacitor chips 150 are sandwiched between conductors 144 and 144'.

Figure 23:
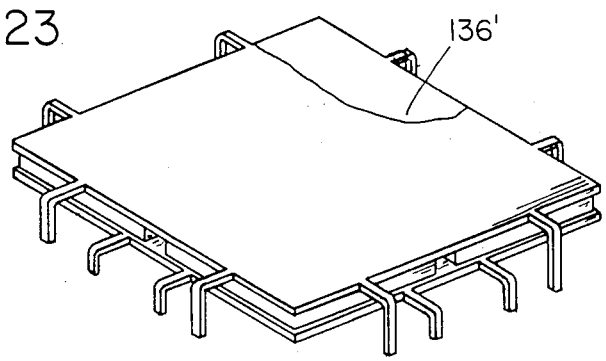
FIG. 23 is a perspective view of the decoupling capacitor of FIG. 20.

Prior to assembly, an array of drops 152 of solder paste or other suitable electrically conductive adhesive material (i.e., epoxy, polyimide, etc.) are placed between each conductor 144 and 144' and each exposed electrode 154 of MLC 150. The assembly is then passed through an oven (infrared) to reflow the solder paste (or cure the conductive adhesive). The assembly is then cleaned to remove the solder flux residues (if appropriate). The encapsulation of the assembly can be accomplished by a molding process (transfer or injection), by a fluidized bed coating process, by an electrostatic epoxy powder spray process, or any other suitable method which provides environmental protection for the assembly. Each individual PGA decoupling device is then cut out from the lead frames and its leads formed for through hole insertion or surface mounting as shown in FIG. 23.

Preferably, MLC 150 will be of the parallel plate type such as one of those MLC'S identified in FIGS. 11-16. Such an MLC is comprised of a ceramic body having interleaved layers of conductive electrodes with its outermost electrodes exposed to define top and bottom connecting surfaces. It will be appreciated that the actual number of interleaved layers of ceramic and metallization will depend upon the degree of desired capacitance.

Turning now to a discussion of prior art FIGS. 1A–B and 2A–B, in FIG. 1A, a leaded surface mounted integrated circuit (IC) chip carrier is shown generally at 170 and is electrically connected to circuit traces on multilayer printed circuit board 172 via a plurality of solder pads 174. A multilayer ceramic capacitor shown generally at 176 is also connected to multilayer circuit board 172 through solder vias 178. Multilayer circuit board 172 includes power (voltage) plane 180 and ground plane 182. Multilayer ceramic capacitor 176 is electrically connected so as to decouple leaded IC chip carrier 170 through vias 178 between the power and ground planes 180 and 182.

In FIGS. 2A and 2B, a surface mounted plastic leaded chip carrier for IC 170' is mounted on a PC board 172' in a manner similar to chip carrier 170 in FIG. 1A. However, unlike FIGS. 1A and 1B, decoupling capacitor 176' is connected to the power and ground planes 180' and 182' of circuit board 172' on the backside thereof and is held onto circuit board 172' by a suitable adhesive identified as 186.

As was discussed with regard to prior art FIGS. 1 and 2, the prior art decoupling schemes of FIGS. 1A–B and 2A–B both suffer from serious deficiencies and drawbacks including high inductance in the leads and printed circuit board traces as well as inefficient use of board real estate which adversely effects component packaging density. It will be appreciated that while the decoupling scheme of FIGS. 2A and 2B improves the packaging density of the printed circuit board, this arrangement requires extra steps for PC board assembly. Such steps include application of adhesive dots 186 to hold the decoupling capacitors 176' in place while they undergo wave soldering; as well as an extra soldering step. Also, the procedure for assembling the decoupling scheme of FIG. 2 subjects both the printed circuit board and the multilayer chip capacitor to the stresses of an extra wave solder cycle (at temperatures of up to 500° F.) since the multilayer chip capacitor will be immersed in molten solder.

These important problems are overcome by a novel decoupling capacitor which is dimensioned and configured specifically to be used in conjunction with a surface mounted leaded chip carrier package for integrated circuits and which is disclosed in U.S. application Ser. No. 763,826 filed Aug. 8, 1985, now U.S. Pat. No. 4,685,387, issued Apr. 14, 1987, which is assigned to the assignee hereof and incorporated herein by reference. However, while well suited for its intended purposes there is a need for decoupling capacitors for surface mounted leaded chip carriers which have higher capacitance values than can be achieved with only a single layer of ceramic material.

It will be appreciated that the several embodiments of decoupling capacitors for PGA packages described in FIG. 17–23 and preferably incorporating the MLC's of FIGS. 11–16 may all be used in conjunction with surface mounted leaded chip carriers. In a preferred embodiment, the decoupling capacitor of FIGS. 17–23 has its leads specifically configured for surface mounting. Fox example, in FIG. 24, a decoupling capacitor is shown at 188 having an external and internal construction which is almost identical to any of the capacitors of FIGS. 17–23. The only difference is that leads 190 and 192 have flattened bottom portions 194 and 196, respectively for ease of surface mounting.

Figure 24:
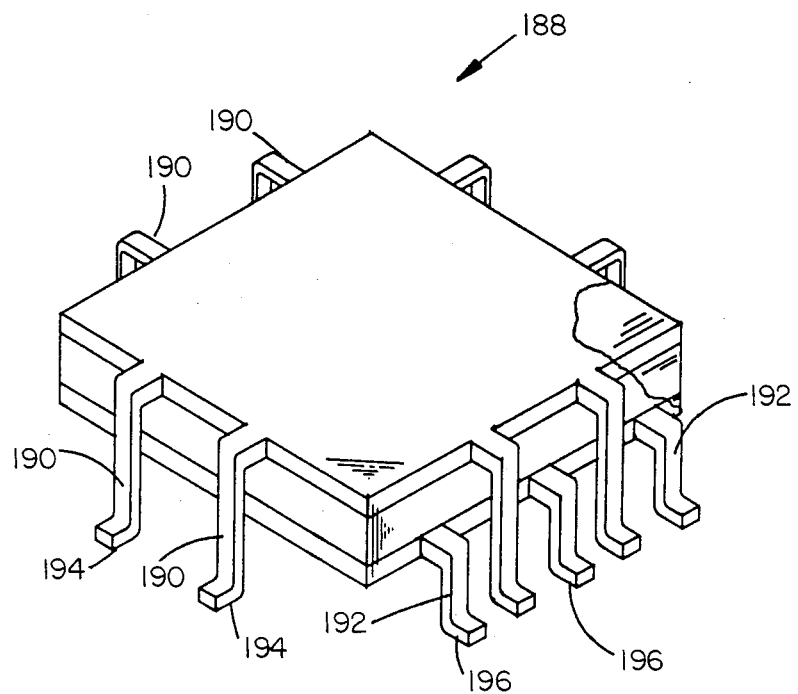
FIG. 24 is a perspective view of a decoupling capacitor incorporating a multilayer capacitor chip therein for use with a leaded surface mounted chip carrier.
Figure 25:
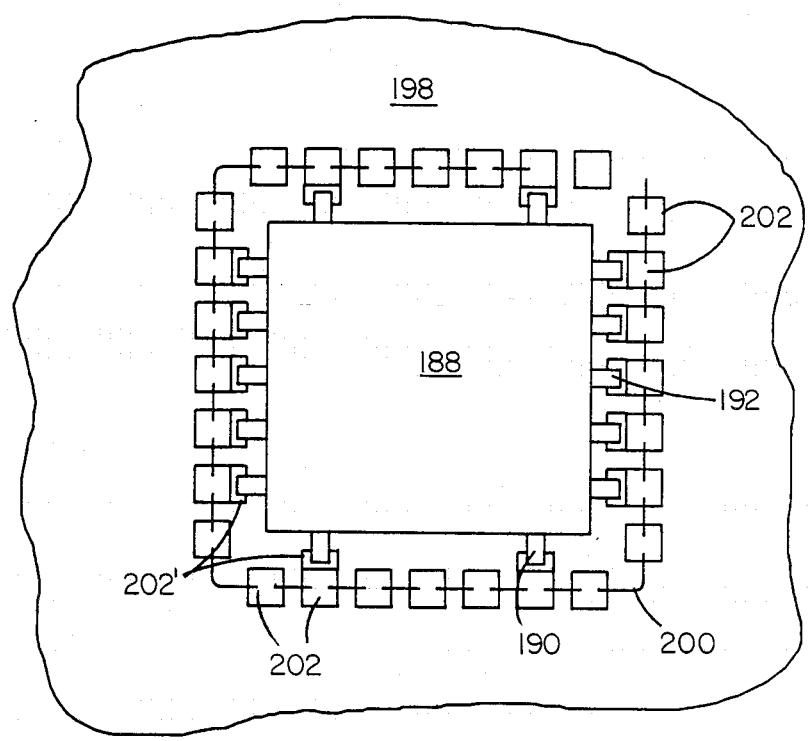
FIG. 25 is a plan view of the decoupling capacitor of FIG. 24 mounted on a circuit board.
Figure 26:
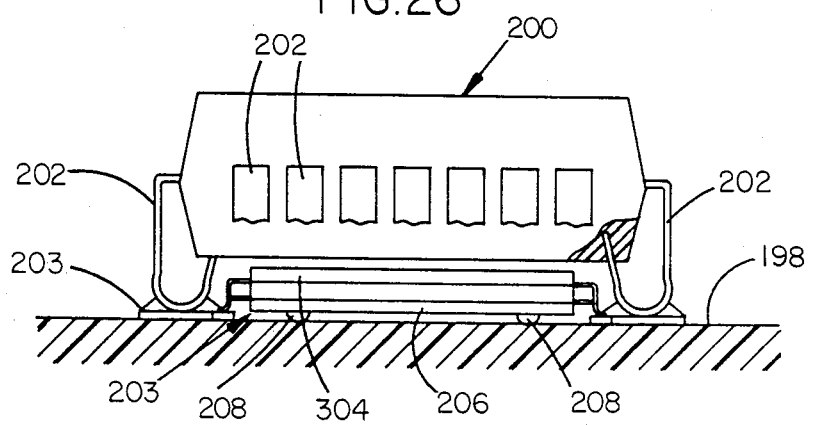
FIG. 26 is a side elevation view of the decoupling capacitor of FIG. 24 mounted under a leaded chip carrier.

Referring now to FIGS. 25 and 26, the decoupling capacitor 188 of FIG. 24 is shown mounted on a rigid circuit board 198 underneath a leaded surface mounted chip carrier for integrated circuits identified at 200. Surface mounted leaded chip carrier packages for integrated circuits of the type shown at 200 in FIG. 26 are well known and include a plurality of power, ground and signal pins 202 which are electrically and mechanically attached to printed circuit board 198 via solder pads 203 using a reflow solder process or the like. In accordance with the present invention, and as shown in FIG. 25, selected power and ground solder pads 202 for chip carrier 200 are extended beneath the chip carrier to permit access of power and ground leads 190 and 192 of decoupling capacitor 188. It will be appreciated that in FIG. 25, the outer perimeter of a conventional chip carrier is schematically shown by the dotted lines 200. Further, conventional solder pads 202 are shown with the extended solder pads 202' interspersed between solder pads 202 provided at locations where leads 190 and 192 of decoupling capacitor 188 will make contact.

The decoupling capacitor 188 of FIG. 24 include a total of fourteen leads 190 and 192, eight leads 190 being connected to top conductor 204, and six leads 194 being connected to bottom conductor 206. However, it will be appreciated that FIG. 24 describes only one particular lead configuration which is suitable for one (or more) particular leaded surface mounted IC chip carrier and its unique power and ground pin configuration. As mentioned with regard to the decoupling capacitor for PGA packages, the dimensions and pin configurations of the decoupling capacitor of the present invention may differ significantly from one particular chip carrier configuration to another. Accordingly, an important feature of the surface mountable decoupling capacitor of the present invention is that it may be easily tailored to be used in conjunction with any surface mounted IC chip carrier. It will further be appreciated that the top and bottom conductors 204 and 206 of decoupling capacitor 188 correspond to power (voltage) and ground pins of chip carrier 200. Accordingly, the leads 190 and 192 will be either power or ground leads and will correspond to the power and ground leads 202 which extend from chip carrier 200.

Decoupling capacitor 188 of the present invention must have a thickness and configuration which permits its placement underneath the leaded chip carrier 200 and between printed circuit board 198. Preferably, decoupling capacitor 102 is provided with set off means 208 which permits cleaning between circuit board 198 and decoupling capacitor 200.

Turning now to a discussion of prior art FIGS. 1C–D and 2C–D, in FIG. 1C, a leadless surface mounted integrated circuit (IC) chip carrier is shown generally at 210 and is electrically connected to circuit traces on multilayer printed circuit board 212 via a plurality of solder pads 214. A multilayer ceramic capacitor shown generally at 216 is also connected to multilayer circuit board 212 through solder vias 218 via a plurality of solder pads 220. Multilayer circuit board 212 includes power (voltage) plane 222 and ground plane 224. Multilayer ceramic capacitor 216 is electrically connected so as to decouple leadless IC chip carrier 210 through vias between the power and ground planes 222 and 224.

Figure 2C:
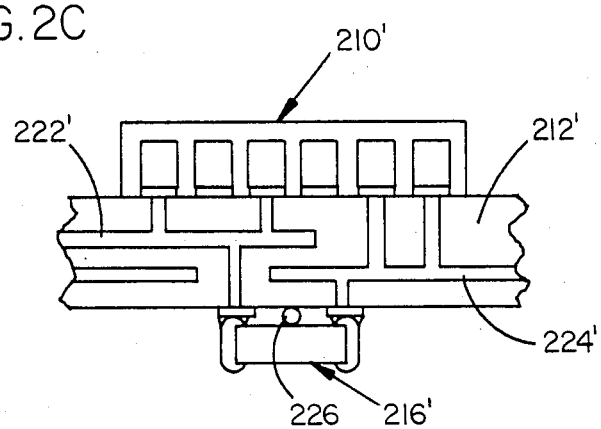
FIG. 2C is a side elevation view of a "leadless" surface mounted IC chip carrier package connected to a ceramic capacitor on the backside of a printed circuit board in accordance with the present invention.
Figure 2D:
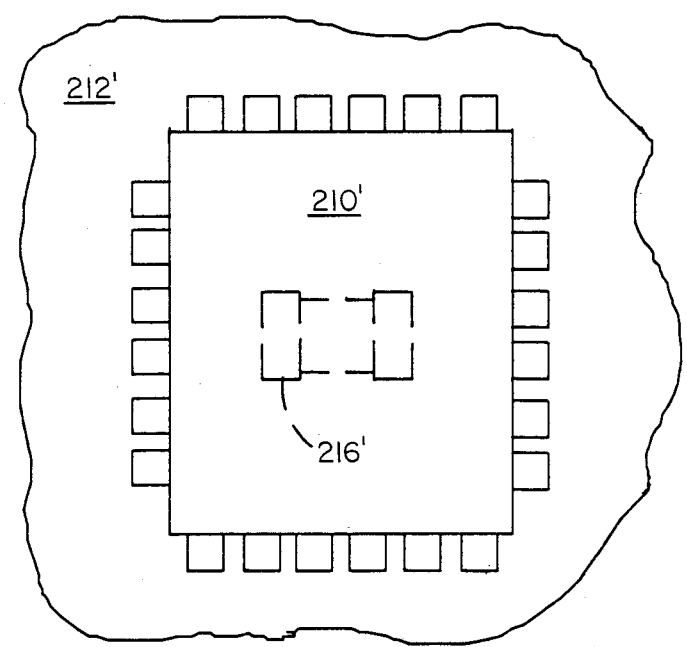
FIG. 2D is a plan view of the IC package and capacitor arrangement shown in FIG. 2C.

In FIGS. 2C and 2D, a surface mounted plastic leadless chip carrier for IC 210' is mounted on a PC board 212' in a manner similar to chip carrier 210 in FIG. 1C. However, unlike FIGS. 1C and 1D, decoupling capacitor 216' is connected to the power and ground planes 222' and 224' of circuit board 212' on the backside thereof and is held onto circuit board 212' by a suitable adhesive identified at 226.

As was discussed with regard to prior art FIGS. 1, 1A-B, 2 and 2A-B, the prior art decoupling schemes of FIGS. 1C-D and 2C-D both suffer from serious deficiencies and drawbacks including high inductance in the leads and printed circuit board traces as well as inefficient use of board real estate which adversely effects component packaging density. It will be appreciated that while the decoupling scheme of FIGS. 2C and 2D improves the packaging density of the printed circuit board, this arrangement requires extra steps for PC board assembly. Such steps include application of adhesive dots 228 to hold the decoupling capacitors 216' in place while they undergo wave soldering; as well as an extra soldering step. Also, the procedure for assembling the decoupling scheme of FIGS. 2C-D subjects both the printed circuit board and the multilayer chip capacitor to the stresses of an extra wave solder cycle (at temperatures of up to 500° F.) since the multilayer chip capacitor will be immersed in molten solder.

These important problems are overcome by the novel decoupling capacitor which is dimensioned and configured specifically to be used in conjunction with a surface mounted leadless chip carrier package for integrated circuits as disclosed in U.S. application Ser. No. 027,932, filed contemporaneously with the present application, and which is a continuation-in-part application of U.S. Ser. No. 763,826 filed Aug. 8, 1985. However, while well suited for its intended purposes, there is a need for decoupling capacitors for surface mounted leadless chip carriers having higher capacitance values than is available with those capacitors utilizing a single layer of ceramic material. Accordingly, the present invention contemplates the use of multilayer capacitive elements in decoupling capacitors for leadless chip carriers.

It will be appreciated that from a structural standpoint, the decoupling capacitor for leadless chip carriers (incorporating at least one MLC therein) of the present invention may be quite similar to either the decoupling capacitors of FIGS. 17-23 for PGA packages; or the decoupling capacitor of FIGS. 24-26 for surface mounted leaded chip carriers. A key distinction is that the decoupling capacitor for leadless chip carriers must be dimensionally configured for positioning over the IC carrier package as opposed to under the IC carrier. This means that the leads extending from the decoupling capacitor must be long enough to contact the printed circuit board solder pads.

Turning now to FIGS. 27 and 28, the decoupling capacitor of either FIGS. 17-23 or FIGS. 24-26 is shown at 230 adapted for use in conjunction with a leadless chip carrier (LCC) 232 of known construction. As mentioned, the construction of leadless chip carrier 232 is well known and includes an integrated circuit within a dielectric housing (typically plastic). The integrated circuit (not shown) within the housing of the LCC is connected to a plurality of metallized solder connects 233 positioned on the outside of LCC 232. Printed wiring board 234 is comprised of a nonconductive substrate having a circuit pattern 236 thereon. At selected areas on circuit pattern 236, the pattern terminates at solder pads 240. It will be appreciated that solder connects 233 on leadless chip carrier 230 will mechanically and electrically connect to solder pads 240 of printed circuit pattern 236 via a reflow or other known process.

In accordance with the present invention, decoupling capacitor 230 is mounted over leadless chip carrier 232 and thereafter connected to selected solderpads 240 on printed wiring board 234. Like the previously described decoupling capacitors having at least one MLC incorporated therein for PGA packages or leaded surface mounted chip carriers, decoupling capacitor 230 has flexible lead locations and multiple pins or leads corresponding to each voltage level of the leadless chip carrier 232. However, the structure of capacitor 230 must be dimensionally configured to be mounted over LCC 232; and therefore leads 242 and 244 must extend far enough to effect connection with solder pads 240. Of course, in an alternative embodiment, decoupling capacitor 230 of FIGS. 27 and 28 may be configured for surface mounting with the incorporation of flattened, planar terminations as in FIG. 24.

Other types of decoupling capacitors incorporating multilayer capacitive elements therein are disclosed in U.S. application Ser. No. 027,739, to Jorge M. Hernandez and Rodney Larson, filed contemporaneously with the present application and assigned to the assignee hereof.

The decoupling capacitor for PGA and surface mounted leaded and leadless packages incorporating multilayer capacitor chips retains all of the many important features and advantages discussed with regard to the single layer capacitor of FIGS. 1-10 such as an overall parallel plate construction for lower inductance. Moreover, the decoupling capacitor incorporating multilayer capacitors as disclosed in FIGS. 11-28 also provide further advantages not found in the single layer capacitors. For example, the decoupling capacitor of FIGS. 11-28 exhibit much higher capacitance values for greater noise reduction than is possible with single layer capacitor elements. Also, the temperature stability of the individual capacitor elements is increased by selection of temperature stable dielectric ceramic formulations in the multilayer chips.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A decoupling capacitor for use with a surface mounted leaded chip carrier package or a surface mounted leadless chip carrier package wherein the surface mounted leaded chip carrier package and surface mounted leadless chip carrier package have an array of conductive connecting means arranged exteriorly on the perimeter thereof, at least some of the conductive connecting means being first and second voltage level conductive connective means, the capacitor including:
   at least one multilayer capacitor chip having interleaved layers of conductive material and dielectric material with alternating layers of conductive material being electrically connected and defining first and second groups of conductive layers, each of said first and second groups having at least one exposed conductive layer defining a first exposed conductive layer and a second exposed conductive layer;

a first conductor in electrical contact with said first exposed conductive layer and defining a first voltage level conductor;

a second conductor in electrical contact with said second exposed conductive layer and defining a second voltage level conductor;

a plurality of first leads in a predetermined configuration in electrical contact with said first conductor and extending outwardly therefrom;

a plurality of second leads in a predetermined configuration in electrical contact with said second conductor and extending outwardly therefrom;

the configurations of said first and second leads corresponding to configurations of first and second voltage levels of connecting means of the surface mounted leaded chip carrier package or surface mounted leadless chip carrier package; and an insulating material surrounding said dielectric body and conductors, said first and second leads extending through said insulating material.

2. The capacitor of claim 1 wherein said at least one multilayer capacitor chip, first conductor, second conductor and insulating material define an insulated assembly and wherein:
said insulated assembly is substantially rectangular.

3. The capacitor of claim 2 wherein:
said insulated assembly is substantially square.

4. The capacitor of claim 1 wherein:
said leads extend outwardly and downwardly perpendicular to said conductors.

5. The capacitor of claim 1 including:
stand off means provided on said insulated assembly.

6. The capacitor of claim 1 wherein said conductive connecting means are leads and wherein said surface mounted leaded chip carrier has a central lead free area surrounded by said leads and wherein:
said at least one multilayer capacitor chip, first conductors, second conductors and insulating material define an insulated assembly, the size of said insulated assembly being less than the size of the central lead free area.

7. The capacitor of claim 1 wherein said conductive connecting means are leads and wherein said surface mounted leaded chip carrier has a central lead free area surrounded by said leads and wherein:
said at least one multilayer capacitor chip, first conductor, second conductor, first leads, second leads and insulating material define an insulated assembly, the size of said insulated assembly being less than the size of the central lead free area.

8. The capacitor of claim 1 wherein:
said first exposed conductive layers and said second exposed conductive layers are substantially parallel to each other and to said first and second conductors.

9. The capacitor of claim 8 wherein:
said dielectric material includes a pair of opposed end surfaces and top and bottom surfaces;
said first group of conductive layers being spaced from one of said opposed end surfaces of said dielectric material and said second group of conductive layers being spaced from the other of said opposed end surfaces of said dielectric material;
a first via through said dielectric material electrically interconnecting said first group of conductive layers and a second via through said dielectric material electrically interconnecting said second group of conductive layers.

10. The capacitor of claim 9 including:
an electroless plating layer over at least a portion of said top and bottom surface of said dielectric material and in said vias.

11. The capacitor of claim 1 including:
an electrically insulative spacing layer, said spacing layer having at least one opening therethrough for receiving said at least one multilayer capacitor chip, said spacing layer being sandwiched between said first and second conductors with said opening communicating between said first and second conductors.

12. The capacitor of claim 1 including:
holes disposed through said first and second conductors, said holes communicating with said first and second exposed conductive layers.

13. The capacitor of claim 12 including:
electrically conductive material in said holes thereby electrically connecting said first and second conductors with respective of said first and second exposed conductive layers.

14. The capacitor of claim 1 including:
a plurality of multilayer capacitor chips sandwiched between said first and second conductors.

15. The capacitor of claim 1 wherein:
said dielectric material is a ceramic material.

16. The capacitor of claim 1 wherein:
said dielectric material includes a pair of opposed end surfaces and top and bottom surfaces, said first exposed conductive layer being disposed on said top surface and said second exposed conductive layer being disposed on said bottom surface;
a first conductive end termination on one of said opposed end surfaces of said dielectric material and a second conductive end termination on the other of said opposed end surfaces of said dielectric material;
said first group of alternating conductive layers terminating at said first conductive end termination and said second group of alternating conductive layers terminating at said second conductive end termination, said first exposed conductive layer being connected and substantially transverse to said first conductive end termination, said second exposed conductive layer being connected and substantially transverse to said second conductive end termination, a first gap being defined between said first exposed conductive layer and said second end termination and a second gap being defined between said second exposed conductive layer and said first end termination.

17. The capacitor of claim 16 including:
diagonally opposed corners in said gaps, a portion of dielectric material in said diagonal corners being removed.

18. The capacitor of claim 16 including:
an electrically insulative cap being provided over each of said first and second conductive end terminations wherein said conductive end terminations are encapsulated and wherein electrical bridging in said gap between said first exposed conductive layer and said second conductive end termination and in said gap between said second exposed conductive layer and said first conductive end termination is precluded by said insulative caps.

19. The capacitor of claim 18 wherein:
said insulative cap is comprised of a material selected from the group comprising glass and epoxy.

20. The capacitor of claim 16 wherein:
said interleaved layers of dielectric material have a predetermined thickness; and
wherein said layers of dielectric material adjacent said top and bottom surfaces have a larger thickness relative to the other layers of dielectric material.

21. An electronic subassembly comprising:
a surface mounted leaded chip carrier package, said surface mounted leaded chip carrier package having an array of leads extending from one side thereof and surrounding a central lead free area of predetermined size, at least some of the leads surrounding the central lead free area being first and second voltage level leads;
a circuit board, said circuit board having first spaced conductive pads receiving said surface mounted leaded chip carrier leads; and
decoupling capacitor means, said decoupling capacitor means being aligned with said central lead free area of said surface mounted leaded chip carrier package and electrically communicating with said circuit board, said capacitor means comprising;
at least one multilayer capacitor chip having interleaved layers of conductive material and dielectric material with alternating layers of conductive material being electrically connected and defining first and second groups of conductive layers, each of said first and second groups having at least one exposed conductive layer defining a first exposed conductive layer and a second exposed conductive layer;
a first conductor in electrical contact with said first exposed conductive layer and defining a first voltage level conductor;
a second conductor in electrical contact with said second exposed conductive layer and defining a second voltage level conductor;
a plurality of first leads in a predetermined configuration in electrical contact with said first conductor and extending outwardly therefrom;
a plurality of second leads in a predetermined configuration in electrical contact with second conductor and extending outwardly therefrom;
the configurations of said first and second leads corresponding to configurations of first and second voltage levels of leads of said surface mounted leaded chip carrier package;
an insulating material surrounding said dielectric body and conductors, said first and second leads extending through said insulating material; and
said at least one multilayer capacitor chip, first conductor, second conductor and insulating material defining an insulated assembly, the size of said insulated assembly being less than the size of the central lead free area.

22. The subassembly of claim 21 wherein:
said decoupling capacitor means is interposed between said central lead free area of said surface mounted leaded chip carrier package and said circuit board.

23. The subassembly of claim 21 wherein:
said insulated assembly is substantially rectangular.

24. The subassembly of claim 23 wherein:
said insulated assembly is substantially square.

25. The subassembly of claim 21 wherein:
said leads extend outwardly and downwardly perpendicular to said conductors.

26. The subassembly of claim 21 including:
stand off means provided on said insulated assembly.

27. The subassembly of claim 21 including:
second spaced pads on said circuit board for receiving said first and second voltage level leads of said decoupling capacitor.

28. The subassembly of claim 21 wherein:
said dielectric body, first conductor, second conductor, first leads, second leads and insulating material have a size which is less than the size of the central lead free area.

29. The subassembly of claim 21 wherein:
said first and second voltage level leads of said decoupling capacitor are received on the same pads as the corresponding first and second voltage level pins of said surface mounted leaded chip carrier package.

30. The subassembly of claim 21 wherein:
said first exposed conductive layers and said second exposed conductive layers are substantially parallel to each other and to said first and second conductors.

31. The subassembly of claim 21 including:
a plurality of multilayer capacitor chips sandwiched between said first and second conductors.

32. An electronic subassembly comprising:
a surface mountable leadless integrated circuit chip carrier package, said leadless chip carrier package having an array of conductive connecting means arranged exteriorly on the perimeter thereof, at least some of the connecting means being first and second voltage level connecting means;
a circuit board, said circuit board having first spaced conductive pads thereon receiving said connecting means from said leadless chip carrier package; and
decoupling capacitor means, said decoupling capacitor means being mounted over and aligned with said leadless chip carrier package and electrically communicating with said circuit board, said capacitor means comprising;
at least one multilayer capacitor chip having interleaved layers of conductive material and dielectric material with alternating layers of conductive material being electrically connected and defining first and second groups of conductive layers, each of said first and second groups having at least one exposed conductive layer defining a first exposed conductive layer and a second exposed conductive layer;
a first conductor in electrical contact with said first exposed conductive layer and defining a first voltage level conductor;
a second conductor in electrical contact with said second exposed conductive layer and defining a second voltage level conductor;
a plurality of first leads in a predetermined configuration in electrical contact with said first conductor and extending outwardly therefrom;
a plurality of second leads in a predetermined configuration in electrical contact with said second conductor and extending outwardly therefrom; and
the configurations of said first and second leads corresponding to configurations of first and second voltage levels of connecting means of said leadless chip carrier package.

33. The subassembly of claim 32 wherein:
said first and second leads are electrically connected to said conductive pads on said circuit board.

34. The subassembly of claim 32 including:

an insulating material surrounding said dielectric body and conductors defining an insulated assembly, said first and second leads extending through said insulating material.

35. The subassembly of claim 32 wherein:

said insulated assembly is substantially rectangular.

36. The subassembly of claim 35 wherein:

said insulated assembly is substantially square.

37. The subassembly of claim 32 wherein:

said leads extend outwardly and downwardly perpendicular to said conductors.

38. The subassembly of claim 32 including:

second spaced pads on said circuit board for receiving said first and second voltage level leads of said decoupling capacitor.

39. The subassembly of claim 32 wherein:

said first exposed conductive layers and said second exposed conductive layers are substantially parallel to each other and to said first and second conductors.

40. The subassembly of claim 32 including:

a plurality of multilayer capacitor chips sandwiched between said first and second conductors.

* * * * *